United States Patent
Shin et al.

(10) Patent No.: US 6,391,717 B1
(45) Date of Patent: May 21, 2002

(54) METHOD OF MANUFACTURING A FLASH MEMORY DEVICE

(75) Inventors: Sung Hun Shin; Byung Hee Cho, both of Ichon-Shi; Ki Jun Kim, Seoul, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/721,933

(22) Filed: Nov. 27, 2000

(30) Foreign Application Priority Data

Dec. 28, 1999 (KR) .............................. 99-63900

(51) Int. Cl.[7] ..................... H01L 21/336; H01L 29/788
(52) U.S. Cl. .................. 438/257; 438/261; 257/315
(58) Field of Search ................. 438/257, 261, 438/262, 264, 267, 263, 260, 291, 296, 287, 591; 257/315, 316, 321, 411, 410, 112

(56) References Cited

U.S. PATENT DOCUMENTS

| | | | | |
|---|---|---|---|---|
| 5,196,361 A | * | 3/1993 | Ong et al. | 438/263 |
| 5,610,091 A | * | 3/1997 | Cho | 438/259 |
| 5,656,527 A | * | 8/1997 | Choi et al. | 438/258 |
| 5,656,837 A | * | 8/1997 | Lancaster et al. | 257/314 |
| 5,977,601 A | * | 11/1999 | Yang et al. | 257/315 |
| 6,020,238 A | * | 2/2000 | He et al. | 438/261 |
| 6,025,228 A | * | 2/2000 | Ibok et al. | 438/261 |
| 6,078,075 A | * | 6/2000 | Widdershoven | 257/316 |
| 6,143,609 A | * | 11/2000 | Sato et al. | 438/257 |
| 6,218,698 B1 | * | 4/2001 | Hai | 257/317 |
| 6,225,162 B1 | * | 5/2001 | Lin et al. | 257/315 |
| 6,284,637 B1 | * | 9/2001 | Chhagan et al. | 438/261 |

FOREIGN PATENT DOCUMENTS

JP    63224367 A  *  9/1988  .......... H01L/29/78

* cited by examiner

Primary Examiner—Trung Dang
Assistant Examiner—Brook Kebede
(74) Attorney, Agent, or Firm—Finnegan, Henderson, Farabow, Garrett & Dunner, L.L.P.

(57) ABSTRACT

There is disclosed a method of manufacturing a flash memory device. In order to solve the problem that the coupling ratio of a gate electrode is low in a stack gate-type flash memory device, the present invention allows a control gate to surround a control gate from its to its bottom. Therefore, the present invention can increase the contact area of the floating gate and the control gate and can also increase the coupling ratio of the gate electrode.

3 Claims, 3 Drawing Sheets

METHOD OF MANUFACTURING A FLASH MEMORY DEVICE

BACKGROUND OF THE INVENTION

CROSS-REFERENCE TO RELATED APPLICATION

Priorty is claimed from Republic of Korean Patent Application No. 99-63900 filed Dec. 28, 1999, which is incorporated in its entirety by reference.

1. Field of the Invention

The invention relates generally to a method of manufacturing a flash memory device. More particularly, the present invention relates to a method of manufacturing a flash memory device capable of improving the operating characteristic of a flash memory device by increasing a coupling ratio of a gate electrode.

2. Description of the Prior Art

In a typical flash memory device, the contact area of a floating gate and a control gate is increased to increase a coupling ratio. In a stack gate flash memory device having a simplified stack structure, however, if its contact area is increased, as its cell size is accordingly increase, there is a limit to increasing the coupling ratio.

FIGS. 1 is a cross-sectional view of a conventional flash memory device.

As shown, after field oxide films 12 are formed on a semiconductor substrate 11 by well process, a tunnel oxide film 13 is formed. Then, a doped polysilicon layer is formed and is then patterned to form a floating gate 14. Next, after a dielectric film 15, a conductive layer for control gate 16 and an anti-reflection film 17 are sequentially formed on the entire structure, they are etched by self-alignment etching process, thus forming a stack gate structure of a floating gate 14 and a control gate 16.

FIGS. 2A and 2B are a schematic view showing capacitance generating between respective terminals of a flash memory device and an equivalent circuit diagram thereof.

If a drain voltage Vd is 0V, the floating gate voltage Vf can be expressed as the following Equation 1.

$$Vf=[(CiPo)/(CiPo+Cgs+Cgd+Cgb)]Vcg \quad \text{[Equation 1]}$$

Where Cipo indicates a capacitance generated at the dielectric film, Cgs indicates a capacitance generated between a gate and a source. Cgd indicates a capacitance generated between gate and drain,. Cgb indicates a capacitance generated between a gate and bulk (or substrate) and Vcg indicates a control gate voltage.

If Vcg=0V, Vf can be expressed as the following Equation 2.

$$Vf=[(Vgd)/(CiPo+Cgs+Cgd+Cgb)] \quad \text{[Equation 2]}$$

Then, as the resulting floating gate voltage Vf is the sum of Equation 1 and Equation 2 by a overlapping principle, the resulting floating gate voltage Vf can be expressed as the following Equation 3.

$$Vf=\{[(CiPo)/(CiPo+Cgs+Cgd+Cgb)]Vcg\}+\{[(Vgd)/(Cipo+Cgs+Cgd+Cgb)]Vd\} \quad \text{[Equation 3]}$$

From, Equation 3, it can be seen that if Cipo is increased, Vf is increased.

Therefore, the capacitance can be expressed into Equation 4.

$$C=A(\text{area})/L(\text{length}) \quad \text{[Equation 4]}$$

As a result, if the contact area A of the floating gate and the control gate is increased. the floating gate voltage Vf can be increased. However, in a simplified stack-type cell structure, there is a limit to increasing the contact area of the floating gate and the control gate. Therefore, there occurs a problem that a device does not operate at a low voltage.

SUMMARY OF THE INVENTION

It is therefore an object of the present invention to provide a method of manufacturing a flash memory device in which a control gate is formed to surround a floating gate from its top to its bottom, in order to increase the contact area of the floating gate and the control gate, thereby increasing the coupling ratio of a gate electrode.

In order to accomplish the above object, a method of manufacturing a flash memory device according to the present invention is characterized in that it comprises the steps of growing a tunnel oxide film on a semiconductor substrate to which a device isolation process is performed; forming a nitride film and a first polysilicon layer for control gate on the tunnel oxide film; after removing the first polysilicon layer for a control gate. the nitride film and the tunnel oxide film on a portion of which a floating gate will be formed, forming a first dielectric film on the entire structure and then removing the first dielectric film on a portion of which the floating gate will be formed to expose the semiconductor substrate; forming a tunnel oxide film on the exposed semiconductor substrate and then forming a polysilicon layer for a floating gate on the entire structure; patterning the polysilicon layer for a floating gate, thus exposing the first polysilicon layer for a control gate located in the region other than the floating gate pattern; forming a second dielectric film on and at the sides of the patterned polysilicon layer for a floating gate; sequentially forming a second polysilicon layer for a control gate and an anti-reflection film on the entire structure; and patterning the control gate by self-alignment etching process to form a source region and a drain region.

BRIEF DESCRIPTION OF THE DRAWINGS

The aforementioned aspects and other features of the present invention will be explained in the following description, wherein.

DETAILED DESCRIPTION OF PREFERRED EMBODIMENTS

The present invention will be described in detail by way of a preferred embodiment with reference to accompanying drawings.

FIGS. 3A to 3D are cross-sectional views of a device for explaining a method of manufacturing a flash memory device according to the present invention.

Figure 1:
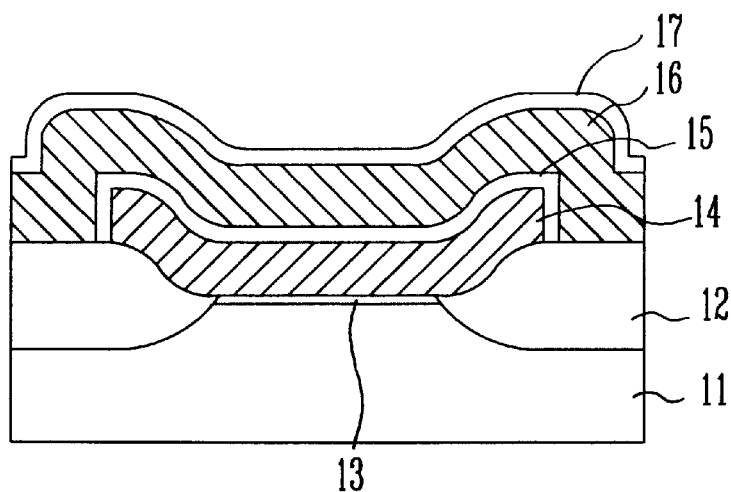
FIGS. 1 is a cross-sectional view of a conventional flash memory device.
Figure 2A:
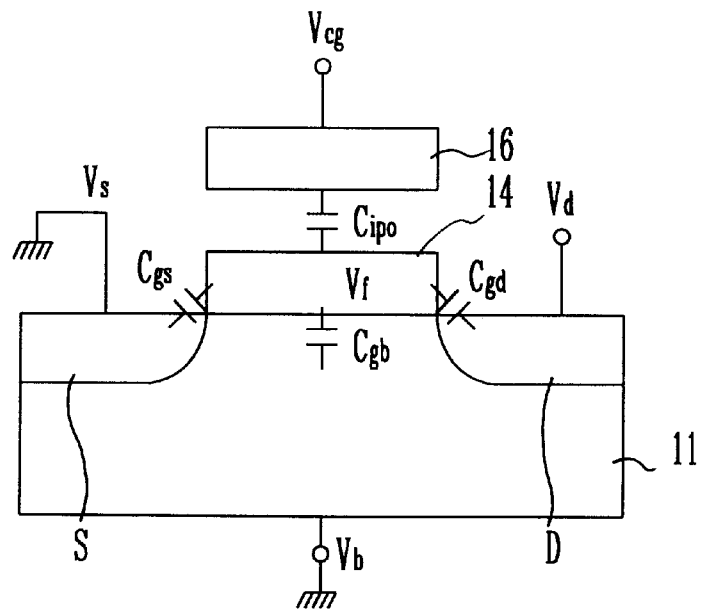
FIGS. 2A and 2B are a schematic view showing capacitance generating between respective terminals of a flash memory device, and an equivalent circuit diagram thereof.
Figure 2B:
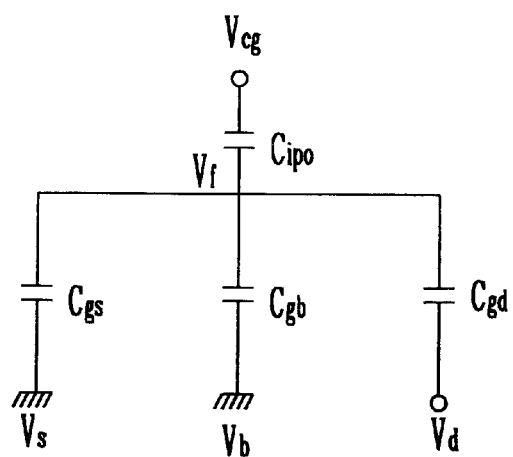
Figure 3A:
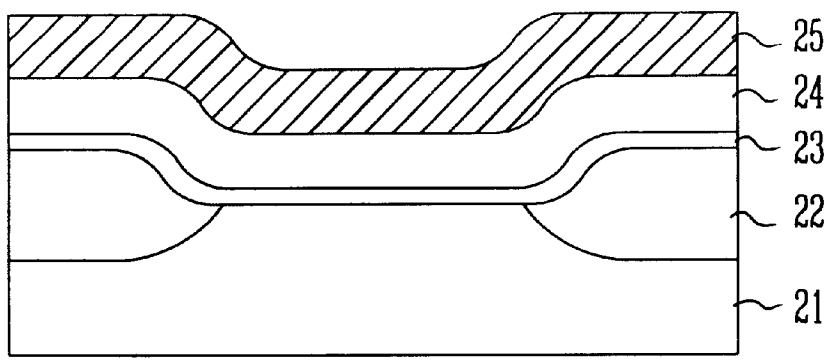
FIGS. 3A to 3D are cross-sectional views of a device for explaining a method of manufacturing a flash memory device according to the present invention.

As shown in FIG. 3A, a tunnel oxide film 23 is formed by device isolation process, on a semiconductor substrate 21 in which field oxide films 22 are formed on. Then, a nitride film 24 and a first polysilicon layer for control gate 25 are sequentially formed on the tunnel oxide film 23. At this time, the nitride film 24 is formed in thickness of 500~1500 Å.

Figure 3B:
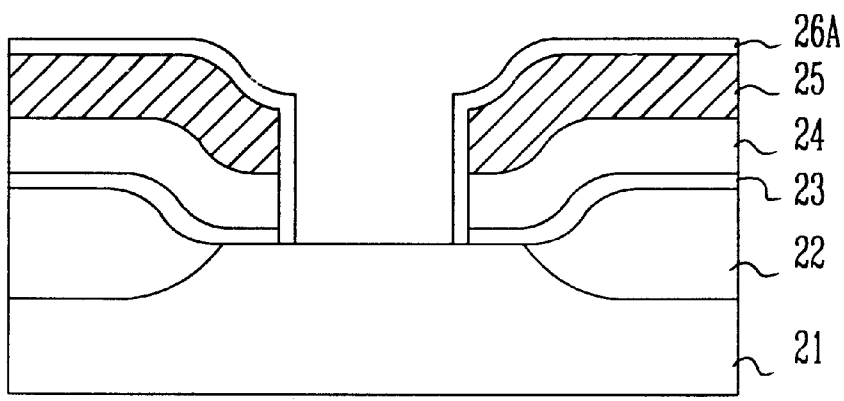

Next, as shown in FIG. 3B, after the first polysilicon layer for control gate 25, the nitride film 24 and the tunnel oxide film 23 on a portion of which a floating gate will be formed are removed, a first dielectric film 26A is formed on the entire structure. Then, the first dielectric film 26A on a portion of which the floating gate will be formed is removed to expose the semiconductor substrate 21.

Figure 3C:
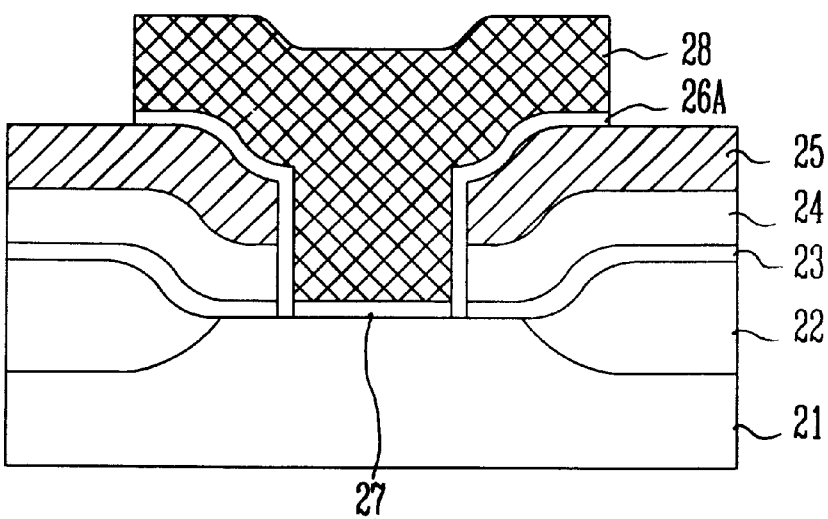

As shown in FIG. 3C, a tunnel oxide film 27 is formed on the exposed semiconductor substrate 21 and a polysilicon layer for a floating gate 28 is then formed. Thereafter, the polysilicon layer for a floating gate 28 is patterned by etching process using a mask for a floating gate. When the polysilicon layer for a floating gate 28 located in the region other than the polysilicon layer, used as a floating gate, is etched. the first dielectric film 26A underlying the polysilicon layer for a floating gate 28 is simultaneously etched to expose the first polysilicon for a control gate 25.

Figure 3D:
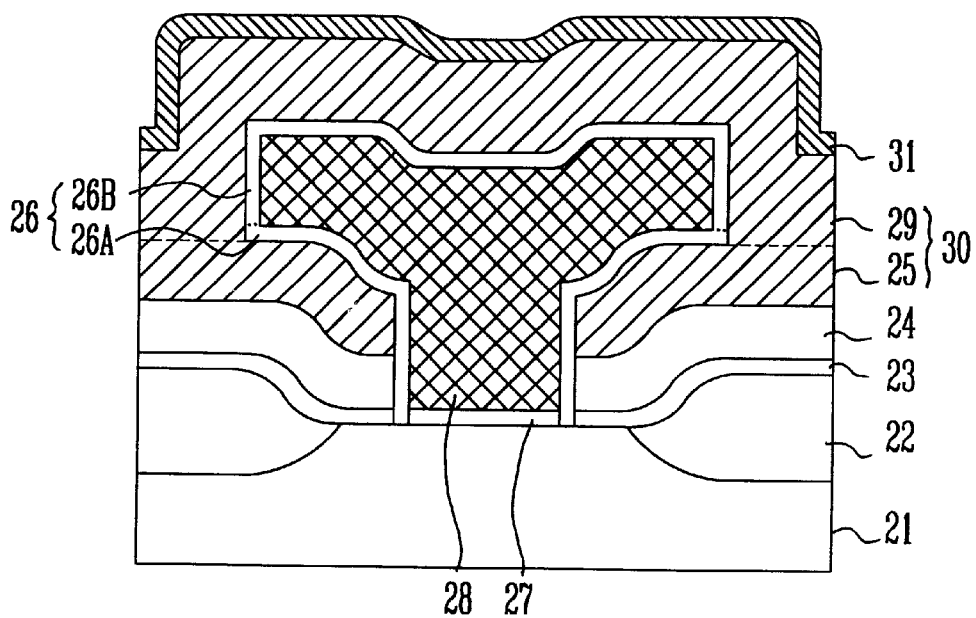

As shown in FIG. 3D, a second dielectric film 26B is formed on and at the sides of the patterned polysilicon layer for a floating gate 28, which is used as the dielectric film 26 of a cell along with the first dielectric film 26A. Then, a second polysilicon layer for a control gate 29 is formed on the entire structure. At this time, the exposed first polysilicon layer for a control gate 25 and the second polysilicon layer for a control gate 29 together functions as the polysilicon layer for a control gate 30. Next, an anti-reflection film 31 is formed on the polysilicon layer for a control gate 30.

Finally, though not shown in the drawing, the control gate is patterned, by self-alignment etching process, to form a source region and a drain region.

As mentioned above, the present invention can improve a program and erase characteristic of a cell, by increasing the contact area of a floating gate and a control gate to maximize the coupling ratio of a gate electrode. Therefore, the present invention has outstanding effects that a device can be safely driven at a low voltage and the throughput of a device can be improved.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising:

growing a first tunnel oxide film on a semiconductor substrate, said growing comprising a device isolation process;

forming a nitride film and a first polysilicon layer for a control gate on said tunnel oxide film;

removing selected portions of said first polysilicon layer, said nitride film, and said first tunnel oxide film at a region for forming a floating gate; forming a first dielectric film on the entire structure; and removing a portion of said first dielectric film in the region for forming said floating gate to expose said semiconductor substrate;

forming a second tunnel oxide film on said exposed semiconductor substrate and subsequently forming a polysilicon layer for a floating gate on the entire structure;

patterning said polysilicon layer to form a patterned polysilicon layer for a floating gate, said patterning further comprising exposing said first polysilicon layer for the control gate located in a region of said device separate from said floating gate;

forming a second dielectric film on exposed top and sides of said patterned polysilicon layer for a floating gate;

forming sequentially a second polysilicon layer for a control gate and an anti-reflection film on the entire structure; and patterning said control gate by a self-alignment etching process to form a source region and a drain region.

2. The method according to claim 1, wherein said nitride film is formed in a thickness ranging from approximately 500 to approximately 1500 Å.

3. The method of manufacturing a flash memory device according to claim 1, wherein when said polysilicon layer for a floating gate is patterned, said first dielectric film located in the region other than said floating gate pattern is simultaneously removed.

* * * * *